(12) United States Patent
Mitani

(10) Patent No.: US 6,633,956 B1
(45) Date of Patent: Oct. 14, 2003

(54) MEMORY CARD WITH TASK REGISTERS STORING PHYSICAL ADDRESSES

(75) Inventor: Hidenori Mitani, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 196 days.

(21) Appl. No.: 09/690,730

(22) Filed: Oct. 18, 2000

(30) Foreign Application Priority Data

Apr. 14, 2000 (JP) .................................. P2000-112995

(51) Int. Cl.[7] .............................................. G06F 12/00
(52) U.S. Cl. ........................ 711/115; 711/103; 711/154; 365/185.33
(58) Field of Search .......................... 711/115, 103, 711/154, 163, 202, 100; 365/185.33; 710/5, 4

(56) References Cited

U.S. PATENT DOCUMENTS

| | | | | |
|---|---|---|---|---|
| 4,829,425 A | * | 5/1989 | Bain et al. ................... 711/202 |
| 5,047,924 A | | 9/1991 | Fujioka et al. ............... 713/501 |
| 5,491,826 A | * | 2/1996 | Koino .......................... 711/5 |
| 5,768,617 A | * | 6/1998 | Liu ............................. 711/4 |
| 6,041,396 A | * | 3/2000 | Widigen ...................... 711/163 |
| 6,185,134 B1 | * | 2/2001 | Tanaka ................... 365/185.33 |
| 6,263,412 B1 | * | 7/2001 | Townsend ................... 711/170 |
| 6,345,367 B1 | * | 2/2002 | Sinclair ...................... 711/100 |
| 6,442,656 B1 | * | 8/2002 | Alasti et al. ................. 711/154 |

FOREIGN PATENT DOCUMENTS

| | | |
|---|---|---|
| JP | 2-12475 | 1/1990 |
| JP | 5-120890 | 5/1993 |

\* cited by examiner

*Primary Examiner*—Pierre-Michel Bataille
(74) *Attorney, Agent, or Firm*—Oblon, Spivak, McClelland, Maier & Neustadt, P.C.

(57) ABSTRACT

A memory card is provided with flash memories operating in parallel under control of a flash interface. Since these flash memories are allocated for a single task, a RAM is provided with task registers. On request for writing from the host, a controller receives logical addresses and data. The logical addresses are then translated into physical addresses with reference to a management table. The physical addresses for write operation are stored in the task registers. After the status checks on the flash memories are complete, the physical addresses stored in the corresponding task registers are erased.

6 Claims, 6 Drawing Sheets

MEMORY CARD WITH TASK REGISTERS STORING PHYSICAL ADDRESSES

BACKGROUND OF THE INVENTION

1. Field of the Invention

The present invention relates to a technique for suppressing operating current for a storage unit which comprises at least one storage element.

2. Description of the Background Art

Currently, a variety of memory cards are used as alternatives to storage media for various pieces of equipment, for example an HDD (hard disc drives), or add-on memory.

Specifications required of these memory cards vary according to their intended purposes. For example when used in desktop personal computers, industrial equipment, or the like, those memory cards require processing capability, typified by write/read speed, rather than low current consumption. Some equipment such as portable personal computers and digital cameras, on the other hand, attach importance to a reduction in power consumption based on the premise that a certain level of processing capability is achieved.

It is however inconvenient to prepare a wide variety of memory cards according to specifications required. Further when different models employ the same memory card as a medium, such a card should preferably be used to specifications suitable for each model. One example is that in order to store image data, a memory card is installed into equipment such as a digital camera that sets importance on lower power consumption, and then in order to read the image data, the memory card is installed into equipment such as a desktop personal computer that sets importance on performance capability.

Japanese Patent Application Laid-open No. 2-12475 (1990) for example discloses EEPROM with a built-in frequency divider that divides a clock signal given from the outside in frequency for the purpose of achieving stable or variable write time.

SUMMARY OF THE INVENTION

A first aspect of the present invention is directed to a memory card comprising: at least one storage element; an original clock generator generating an original clock; and a frequency divider dividing the original clock in frequency in a variable divisional ratio to produce a clock signal that defines an operating frequency of the storage element.

According to a second aspect of the present invention, in the memory card of the first aspect, the setting of the divisional ratio corresponds to the setting of power consumption for the memory card.

According to a third aspect of the present invention, the memory card of the first or second aspect further comprises: a frequency dividing register for setting the divisional ratio.

Preferably in the memory card, the frequency dividing register should be located in a RAM attached to a CPU which controls an operation of the storage element.

A fourth aspect of the present invention is directed to a memory card comprising: a plurality of storage elements; and a plurality of task registers for storing physical addresses used in writing to the plurality of storage elements.

Preferably in the memory card, the plurality of task registers should be located in a RAM attached to a CPU which controls operations of the storage elements.

According to a fifth aspect of the present invention, in the memory card of the fourth aspect, one of the plurality of task registers alternately stores the physical addresses for at least two of the plurality of storage elements.

Preferably, the memory card should further comprises: a task register number setting register for storing a number of the plurality of task registers to be used to alternately store the physical addresses for at least two of the plurality of storage elements, the task register number setting register being located in a RAM attached to a CPU which controls operations of the storage elements.

According to a sixth aspect of the present invention, the memory card of the fourth or fifth aspect further comprises: data registers provided in correspondence with the task registers, for storing write data written at the physical addresses.

Preferably in the memory card, the data registers should be located in a buffer for the plurality of storage elements.

A seventh aspect of the present invention is directed to a method of controlling a memory card which comprises at least one storage element, an original clock generator generating an original clock, and a frequency divider producing a clock signal that defines an operating frequency of the memory element on the basis of the original clock. The method provides a variable control over a divisional ratio of the frequency divider.

According to an eighth aspect of the present invention, in the method of the seventh aspect, the setting of the divisional ratio corresponds to the setting of power consumption for the memory card.

A ninth aspect of the present invention is directed to a method of controlling a memory card which comprises a plurality of storage elements and a plurality of task registers storing physical addresses used in writing to the plurality of storage elements. The method comprises the steps of: (a) storing a physical address used in writing to a first one of the storage elements into a first one of the task registers; (b) performing writing to a second one of the storage elements; (c) checking the status of the first one of the storage elements after the steps (a) and (b); and (d) when the result of the step (c) is an error, performing rewriting using the physical address stored in the first one of the task registers.

According to a tenth aspect of the present invention, in the method of the ninth aspect, one of the plurality of task registers alternately stores the physical addresses for at least two of the plurality of storage elements.

In accordance with the memory card of the first aspect and its method of control of the seventh aspect, a variable divisional ratio makes variable the operating frequency of the memory element. This achieves variable processing capability and operating power of the memory card.

In accordance with the memory card of the second aspect and its method of control of the eighth aspect, if power consumption is set, the memory element operates at the corresponding operating frequency. This reduces power consumption.

In accordance with the memory card of the third aspect, the divisional ratio can be set in the interior of the memory card.

In accordance with the memory card of the fourth aspect and its method of control of the ninth aspect, since a task register holds the physical addresses used in writing to the first one of the memory elements, rewrite processing can be performed even if the write instruction for the first one of the memory elements is not executed properly. Therefore, a write instruction for the second one of the memory elements can be executed after the execution of the write instruction for the first one of the memory elements without making a check for the completion of the write instruction for the first one of the memory elements. This allows for ease in parallel write processing.

In accordance with the memory card of the fifth aspect and its method of control of the tenth aspect, the highest number of memory elements used for parallel write processing is limited to the number of to-be used task registers. Thus, power consumption can be reduced by limiting the number of task registers.

In accordance with the memory card of the sixth aspect, rewriting can be performed since the data registers hold already-written data.

An object of the present invention is to provide a technique for adjusting the specifications of memory cards in various manners to their applications for variable processing capability and operating power.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
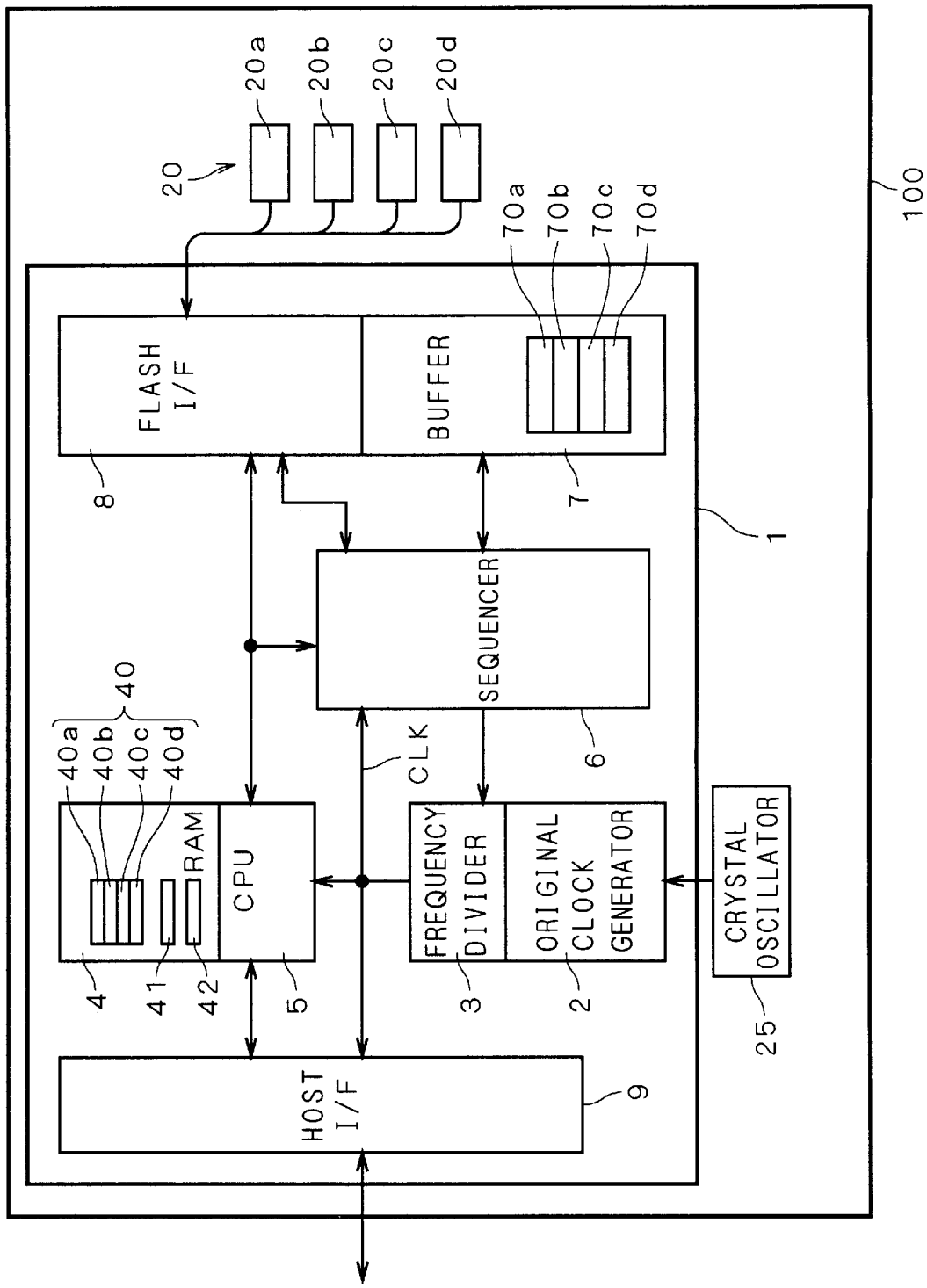
FIG. 1 is a block diagram of the configuration according to a first preferred embodiment of the present invention.

This preferred embodiment provides a technique for achieving a variable operating frequency of a memory card. FIG. 1 is a block diagram showing a configuration of a memory card 100 according to the first preferred embodiment of the present invention. The memory card 100 is broadly divided into a flash memory group 20, a controller 1, and a crystal oscillator 25. Of course, a non-crystal oscillator such as ceramics may be used as an alternative to the crystal oscillator 25.

The flash memory group 20 comprises at least one flash memory; and in this case, it comprises four flash memories 20a, 20b, 20c, and 20d.

Because there are a plurality of flash memories 20a, 20b, 20c, 20d and also each of those memories may include a bad sector, internal physical addresses are not contiguous. Thus, the memory card 100 is provided with the controller 1 for translating the physical addresses into logical addresses that form contiguous address space when viewed from the host end.

The controller 1 comprises a CPU (Central Processing Unit) 5 for performing such translation and exercising management and control of the flash memories in response to requests from the host. The controller 1 further comprises a host interface (host I/F) 9 for providing consistency in the specifications of interface with the host in which the memory card 100 is to be installed, and a flash interface (flash I/F) 8 for providing consistency in the specifications of interface with the flash memory group 20. The controller 1 also comprises a sequencer 6 which operates under instructions from the CPU 5, so processing on the flash interface 8 is performed either by the sequencer 6 or directly by the CPU5.

The CPU5 includes a RAM 4 attached thereto for storing a management table which describes the correspondence between the physical and logical addresses. This able is created as part of factory formatting at the time of collection of the memory cards 100 in manufacturing plants. In addition to the creation of the management table, the execution of factory formatting includes the settings of user and alternate areas, the production of unformatted information for a file system called a "FAT (File Allocation Table)", and the execution of formatting by the DOS (Disk Operating System) format command. The creation of the management table and the settings of user and alternative areas are implemented via such firmware that the CPU5 uses the RAM 4 in the interior of the controller 1, the results of which are stored in the flash memory group 20.

The controller 1 further comprises an original clock generator 2 for generating an original clock on the basis of an oscillation signal from the crystal oscillator 25, and a frequency divider 3 for producing a clock signal CLK from either the as-is status of the original clock or a frequency-divided original clock. The clock signal CLK is fed to the host interface 9 and the sequence 6 to define their operating frequencies and hence to define the operating frequency of the flash memory group 20.

Figure 2:
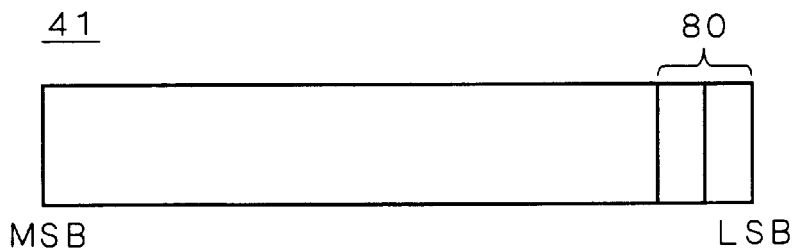
FIG. 2 illustrates the contents of a frequency dividing register.

The divisional ratio in which the frequency divider 3 makes a frequency division is set by the RAM 4. FIG. 2 illustrates the contents of a frequency dividing register 41 provided for the RAM 4 for the setting of the divisional ratio. The total number of bits of this frequency dividing register 41 vary according to usage patterns of the RAM 4, but by using N bits (N≧1) of which, one divisional ratio can be selected from among $2^N$ divisional ratios (which may include the case of no frequency division, i.e., "1").

For example, 2 bits 80 of the above frequency dividing register 41, consisting of the least significant bit (LSB) and the next high-order bit to the LSB, are used for the setting of the divisional ratio. When the 2 bits 80 are "00", "01", "10", or "11", the divisional ratio is set to 1, ½, ¼, or ⅛, respectively. High-order bits other than the 2 bits 80 can be considered as undefined bits, for example.

When the host connected with the memory card 100 is a digital camera, it is desirable to decrease the operating frequency of the memory card 100 for lower power consumption. When the CPU 5 recognizes the host equipment as a digital camera through the host interface 9, it accesses the frequency dividing register 41 to set the contents of the 2 bits 80 to "11" for example so that the divisional ratio becomes ⅛.

The sequencer 6 controls the frequency divider 3 so that the frequency divider 3 makes a frequency division in the divisional ratio set by the CPU 5. Or the frequency divider 3 operates directly on the basis of the 2 bits 80. Similarly when the host connected with the memory card 100 is a desktop personal computer, it is desirable to increase the operating frequency of the memory card 100 for improved processing capability. Thus, the contents of the 2 bits 80 are set to "00" for example so that the divisional ratio becomes 1.

In this way, this preferred embodiment provides the frequency divider 3 for dividing an original clock in frequency (the divisional ratio may include the case of no frequency division, i.e., "1") and achieves a variable divisional ratio; therefore, the operating frequency of the memory card 100 can be controlled according to the host equipment. This allows the memory card 100 to be adjusted in various manners to its applications, thereby achieving variable processing capability and operating power. In addition, the divisional ratio is set by the frequency dividing register 41 in the RAM 4; therefore, the divisional ratio can be controlled in the interior of the memory card 100.

Second Preferred Embodiment

Examples of memory cards include the ones that conform to ATA (AT Attachment: interface standard established by the American National Standards Institute) (hereinafter referred to as "ATA cards"). For the ATA cards, format information giving their specifications data is defined and called a drive parameter. Since the drive parameter has a portion to define vendor-unique information, the divisional ratio described in the first preferred embodiment can be set in that portion. The drive parameter is stored for example in the flash memory group 20.

Figure 3:
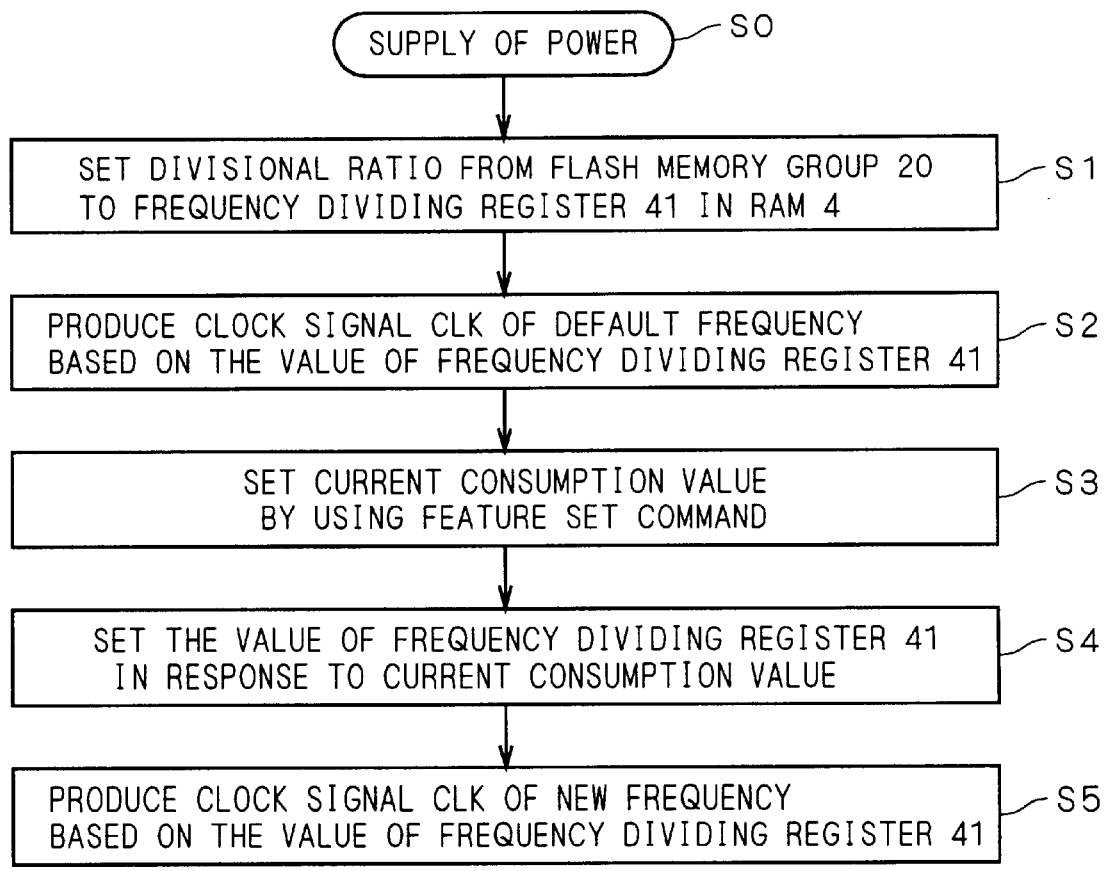
FIG. 3 is a flow chart showing the operation according to a second preferred embodiment of the present invention.

FIG. 3 is a flow chart showing how to set the operating frequency of the memory card 100. The flow starts upon the supply of power to the memory card 100 in step SO. In step S1, the divisional ratio set in the drive parameter is read from the flash memory group 20 through the flash interface 8 and written into the 2 bits 80 of the frequency dividing register 41. This defines a default value for the operating frequency of the memory card 100. Then in step S2, the frequency divider 3 produces a clock signal CLK of a default frequency using the divisional ratio based on the 2 bits 80.

For the ATA cards, ATA commands to drive or control those cards are provided. The ATA commands include a "FEATURE SET" command to set a value of current consumption. Step S3 and later are processing to vary current consumption in the ATA cards. To be precise, a desired value of current consumption is set in step S3 by using the FEATURE SET command, and more specifically, by the host through the host interface 9. Then in step S4, the CPU 5 stores, into the 2 bits 80 of the frequency dividing register 41 in the RAM 4, a divisional ratio for use in setting the clock signal in an appropriate frequency in view of the current consumption value.

In the following step S5, the frequency divider 3 produces a clock signal CLK of a new frequency based on the 2 bits 80 in the same manner as in step S2.

In this way, this preferred embodiment produces a clock signal of the default frequency when no command is given and a clock signal of the frequency suitable for current consumption when a command to define current consumption is given. Thus, the operating frequency of the memory card 100 can be controlled in response to requests from the host.

Third Preferred Embodiment

Figure 4:
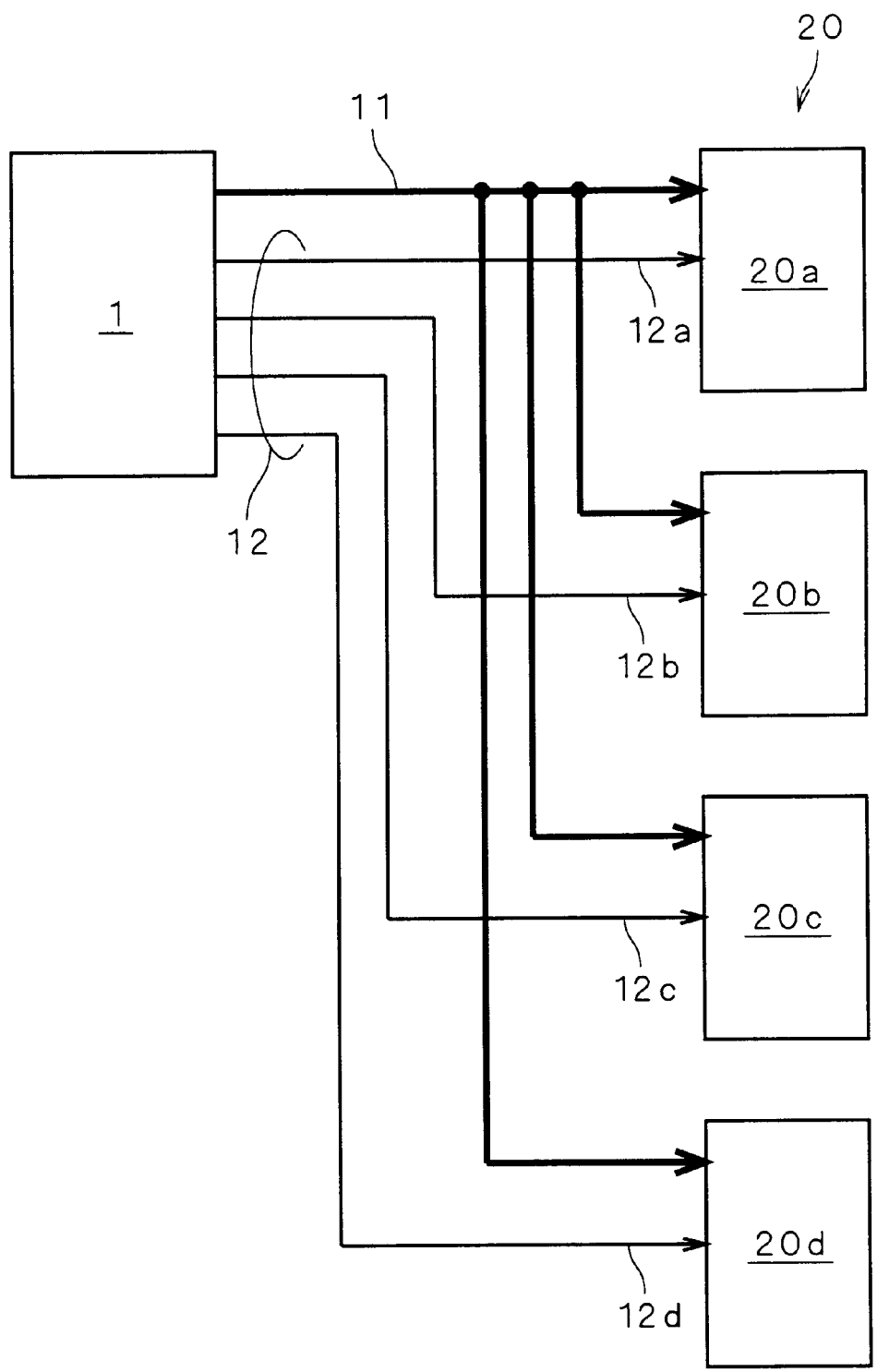
FIG. 4 is a block diagram illustrating the operation according to a third preferred embodiment of the present invention.

FIG. 4 is a block diagram illustrating signal transmission between the controller 1 and the flash memory group 20 in part. The ATA card is usually provided with the flash memory group 20 including a plurality of flash memories 20a to 20d for higher write processing (hereinafter, writing in the memory card 100 is referred to as "write processing"), and those flash memories operate in parallel under control of the flash interface 8 shown in FIG. 1. The drawing illustrates that four flash memories are housed in the flash memory group 20 as individual ICs (integrated circuits).

To select a flash memory to be read or written, the controller 1 produces chip selection signals 12a, 12b, 12c, and 12d corresponding to the flash memories 20a, 20b, 20c, and 20d, respectively. All signals except the chip selection signals such as data, addresses, ready signals, busy signals, and write instructions are represented by a control signal 11 as one thing.

A write operation by each flash memory from start to finish (hereinafter writing performed by each flash memory is referred to as "write operation") generally takes several milliseconds, so parallel write processing is performed to improve the speed of write processing as a whole in the memory card 100. Such parallel write processing is disclosed for example in Japanese Patent Application Laid-open No. 5-120890 (1993). Read processing, on the other hand, is performed for each flash memory.

For example when the chip selection signal 12a corresponding to the flash memory 20a is set active for the execution of a write instruction, first write data is written into the flash memory 20a. On starting the write operation, the flash memory 20a provides a busy signal to the controller 1. In response to this signal, the controller 1 sets the chip selection signal 12a inactive.

The controller 1 then sets the chip selection signal 12b active to give a write instruction, whereby second write data following the first write data is written into the flash memory 20b.

After third write data following the second write data and fourth write data following the third write data have been written into the flash memories 20c and 20d respectively by repetition of such operations, the flash memory 20a is selected as a candidate for write processing for fifth write data following the fourth write data. That is, the chip selection signal 12a is set active.

However since the flash memory 20a has already started the write operation for the first write data, it is necessary to check whether or not the write operation has been completed. For this reason, a status register of the flash memory 20a is checked before the execution of a new write instruction for the flash memory 20a. No status error indicates the completion of write processing for the first data. On the other hand if an error is found, the first write data must be rewritten into the flash memory 20a. Here performing such a status check and rewriting after each write instruction makes difficult the execution of parallel write processing.

In this preferred embodiment, write processing on each of the flash memories 20a to 20d is treated as a single task. Since these flash memories are allocated for a single task, the RAM 4 shown in FIG. 1 is provided with as many task registers as the flash memories (four in this case) in the flash memory group 20.

Figure 5:
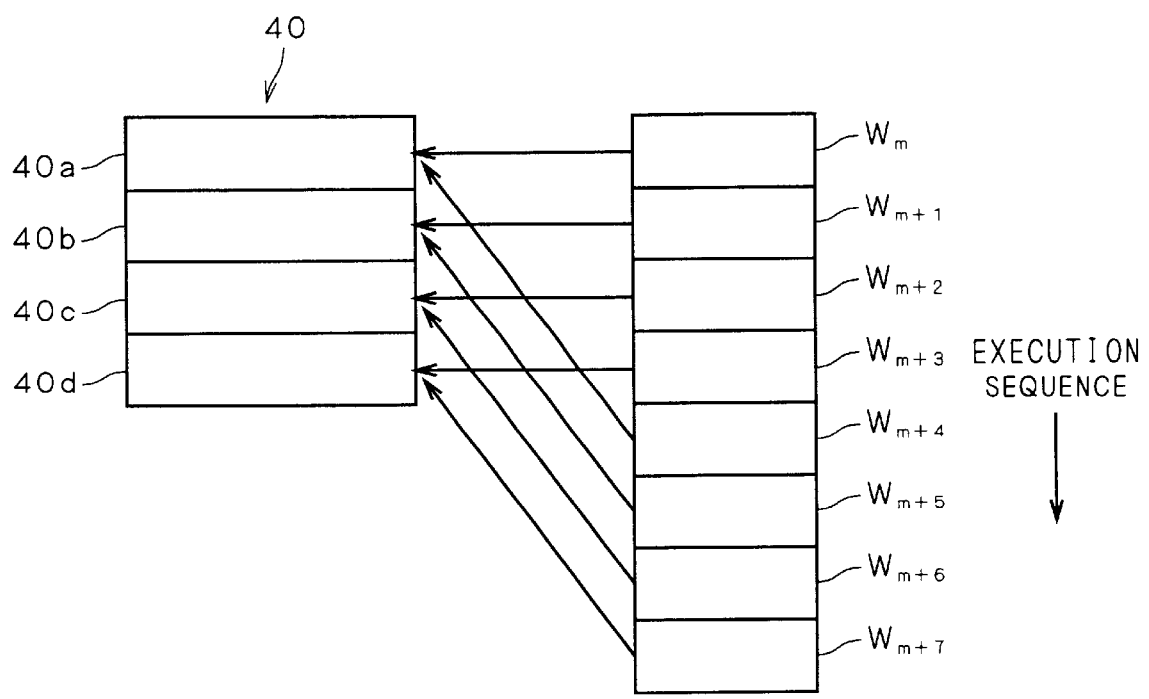
FIG. 5 illustrates the operation of the third preferred embodiment.

FIG. 5 is a schematic diagram showing a relationship between a task register group 40 and write instructions $W_m$ to $W_{m+7}$ (m is a positive integer). The task register group 40 includes task registers 40a, 40b, 40c, and 40d. The write instructions $W_{m+4n}$, $W_{m+4n+1}$, $W_{m+4n+2}$, and $W_{m+4n+3}$ (n is a positive integer or zero) represent write instructions for the flash memories 20a, 20b, 20c, and 20d, respectively, and the write instructions $Wm$ to $W_{m+7}$ are executed in that order.

On requests for writing from the host (hereinafter writing requested by the host is referred to as a "write request"), the controller 1 receives logical addresses and data. The logical addresses entered from the host are translated into physical addresses with reference to the management table. Hereinafter the description proceeds as a first logical address on the write request is translated into a physical address corresponding to the flash memory 20a.

First, the first logical address and the corresponding physical address are stored in the task register 40a. Then the write instruction $W_m$, given to the flash memory group 20, starts the write operation by the flash memory 20a and the flash memory 20a outputs a busy signal to the controller 1. In a similar manner, next data is written into the flash memory 20b by the write instruction $W_{m+1}$.

(i) When single write processing on the flash memories 20a and 20b is enough to satisfy the write request from the host:

After the execution of the write instruction $W_{m+1}$, a check is made whether or not the write operation has been completed properly. The controller 1 reads the physical address from the task register 40a to check the status of, in this case, the flash memory 20a corresponding to that address. If the status is OK, the write operation by the flash memory 20a has been completed; therefore, the controller 1 reads the physical address from the task register 40b to check the status of the flash memory 20b corresponding to that address.

If an error is found in the above status checks, rewriting is performed using physical addresses stored in the task registers. After the status checks on the flash memories are complete, the addresses stored in the corresponding task registers are erased.

For such rewriting of data, a buffer 7 includes data registers corresponding to the task registers. For example, data buffers 70a, 70b, 70c, and 70d are provided correspondingly respectively to the task registers 40a, 40b, 40c, and 40d. If in the earlier example an error is found in the status check on the flash memory 20a, write data for the write instruction $W_m$ is read from the data buffer 70a.

In this fashion, the task register 40a stores the physical address used in the write processing by the instruction $W_m$ and the data buffer 70a stores the write data therefor. Thus even through writing to the flash memory 20a is not performed properly, rewriting to the flash memory 20a can be performed only after the completion of write processing on the flash memory 20b. That is, the write instruction $W_{m+1}$ on the flash memory 20b can be executed after the execution of the write instruction $W_m$ on the flash memory 20a without making a check for normal completion of the write processing by the instruction $W_m$. This allows for ease in parallel write processing.

(ii) When single write processing on the flash memories 20a to 20d is not enough to satisfy the write request from the host:

This is the case where the number of write processing that the memory card 100 performs for a single write request from the host exceeds the number of flash memories in the flash memory group 20. To put it in FIG. 5, the write instructions $W_m$ to $W_{m+3}$ won't be enough and thus the write instruction $W_{m+4}$ and later become necessary.

As has been described, a candidate for write processing after the execution of write processing on the flash memory 20d is the flash memory 20a. Thus, as in the case (i), the controller 1 reads the physical address from the task register 40a to check the status of, in this case, the flash memory 20a corresponding to that address.

Before starting second write processing on the flash memory 20a (corresponding to the write instruction $W_{m+4}$), no status check has been made and thus the physical address remains unerased in the task register 40a. Thus, if a physical address remains in a task register, a status check is made on the corresponding flash memory. When the status of the flash memory 20a is OK, write processing by the write instruction $W_{m+4}$ is performed. If an error is found in the status check, write processing by the write instruction $W_{m+4}$ is performed only after the write data for the first write instruction $W_m$ is rewritten into the flash memory 20a.

In this fashion, even though writing to the flash memory 20a is not performed properly, rewriting to the flash memory 20a can be performed only after the completion of write processing on the flash memory 20d since the task register 40a stores the physical address used in the write processing by the instruction $W_m$ and the data buffer 70a stores the write data therefor. That is, the write instructions $W_{m+1}$, $W_{m+2}$, and $W_{m+3}$ for the flash memories 20b, 20c, and 20d can be executed after the execution of the write instruction $W_m$ for the flash memory 20a without making a check for normal completion of the write processing by the instruction $W_m$.

Figure 6:
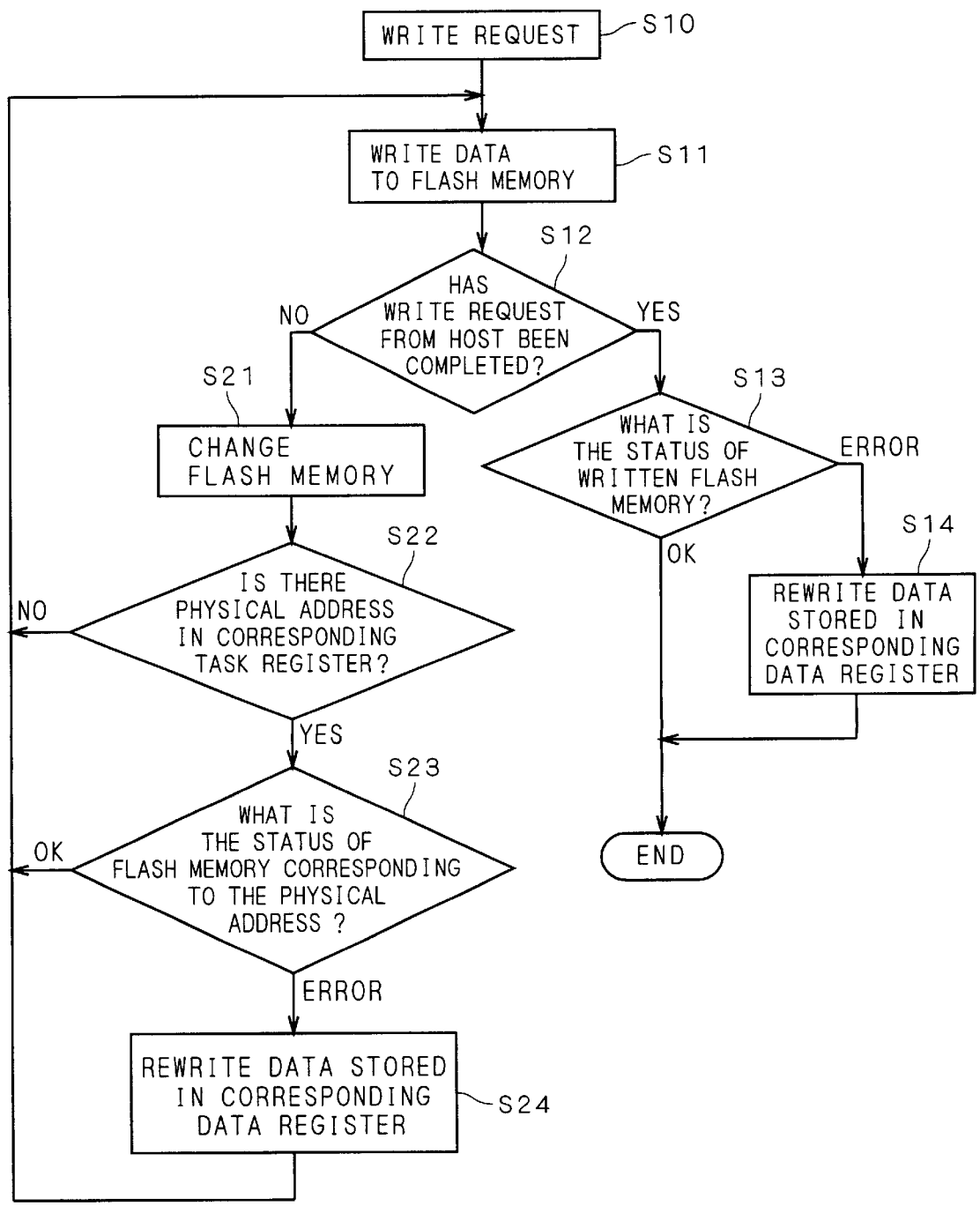
FIG. 6 is a flow chart showing the operation of the third preferred embodiment.

FIG. 6 is a flow chart of write processing adaptable in common to the cases (i) and (ii). Upon receipt of a write request from the host in step S10, the memory card 100 writes data into a predetermined flash memory. In the cases (i) and (ii), a flash memory for use in the first execution of step S11 is the flash memory 20a. The next step S12 determines whether or not the write request from the host has been completed. Since the write request from the host is not satisfied only with write processing on the flash memory 20a in either case of (i) and (ii), the judgement in step S12 results in "NO" and the process goes to step S21. Step S21 changes the flash memory into another. When the flash memories 20a, 20b, 20c, and 20d are all candidates for write processing in step S11, each of the flash memories 20b, 20c, 20d, and 20a or its corresponding task register and data register are to be candidates for each flow after the execution of step S21. In the earlier example, since the candidate for write processing in step S11 was the flash memory 20a, the flash memory 20b or its corresponding task register 40b and data buffer 70b can be candidates for processing in steps S22 to S24.

In step S22 following step S21, it is determined whether or not a task register corresponding to the flash memory concerned holds a physical address. In either case of (i) and (ii), the flash memory 20b has not yet undergone write processing and thus the corresponding task register 40b holds no physical address. Accordingly, the judgment in step S22 results in "NO" and the process returns to step S11.

In the second execution of step S11 after the execution of step S10, data is written into the flash memory 20b in either case of (i) and (ii), and the process goes to step S12.

Hereinafter the cases (i) and (ii) will have different flows of processing. In the case (i), the judgment in step S12 results in "YES" and the process goes to step S13. In step S13, the status of the data-written flash memories 20a and 20b are checked. If an error is found, the process goes to step S14 to rewrite data stored in the corresponding data register is rewritten as has been described. If the status is OK, all write processing for the write request has been completed, and thus the flow is completed.

In the case (ii), at least one write processing is performed on the flash memories 20a to 20d and second write processing is further performed on the flash memory 20a. Thus immediately after the first write processing on the flash memory 20b in step S11, the judgment in step S12 results in "NO" and the process goes to step S21. In step S21, the flash memory concerned is changed into the flash memory 20c. After further two repetitions of steps S22, S11, S12 and S21, whether or not the task register 40a corresponding to the flash memory 20a holds a physical address is determined in step S22. The task register 40a at this time holds a physical address since no status check has not been made since the execution of step S10 as described. Thus, the judgement in step S22 results in "YES" for the first time and the process goes to step S23.

In step S23, a check is made as in step S13 for the status of the flash memory concerned, that is, the flash memory 20a corresponding to the physical address held in the task register 40a. If the status is OK, the process goes to step S11 to write data into the flash memory 20a. If an error is found in the status check, on the other hand, the process goes to step S24 to rewrite data, which is stored in the corresponding data register, into the flash memory 20a as in step S14. The process then returns to step S11 to write new data into the flash memory 20a.

Fourth Preferred Embodiment

As in the third preferred embodiment even if there are the identical number of task registers 40a to 40d (four in the above example) as the flash memories 20a to 20d in the flash memory group 20, it is possible to exercise control for suppression of power consumption. If a request to suppress power consumption arises, e.g., when the host gives such an instruction or when the CPU 5 recognizes the host equipment as placing importance on low power consumption rather than processing capability, restrictions can be placed on the number of to-be-used task registers.

Figure 7:
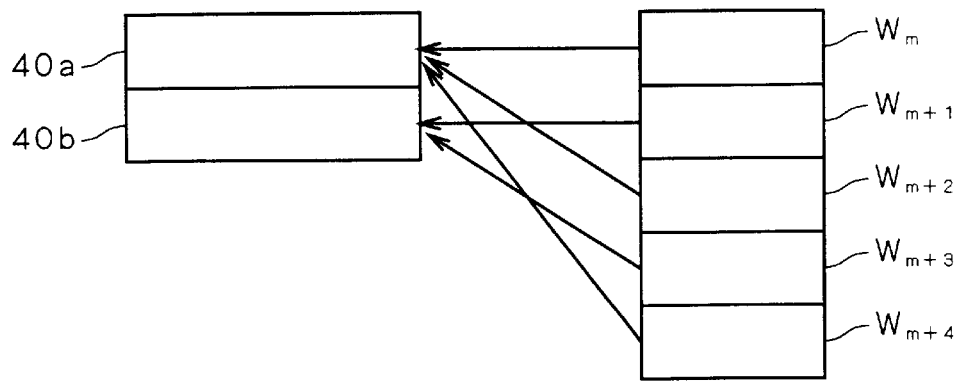
FIG. 7 illustrates the operation according to a fourth preferred embodiment of the present invention.

FIG. 7 is a schematic diagram showing a relationship between the task register group 40 and the write instructions $W_m$ to $W_{m+4}$ according to this preferred embodiment. Also in this case, the write instructions $W_m$ to $W_{m+4}$ perform write processing on the flash memories 20a to 20d. The drawing illustrates the case where single write processing on the flash memories 20a and 20b is not enough to satisfy the write request from the host, for example, at least the write instructions $W_m$ to $W_{m+4}$ are necessary for the write request.

In the case of FIG. 7, power consumption is lower than that in the third preferred embodiment, where the task register 40a serves for both the flash memories 20a and 20c and the task register 40b for both the flash memories 20b and 20d.

After the execution of the write instruction $W_m$, the write instruction $W_{m+1}$ for write processing on the flash memory 20b will be executed without checking the status of the flash memory 20a as in the third preferred embodiment. After the execution of the write instruction $W_{m+1}$, the write instruction $W_{m+2}$ for write processing on the flash memory 20c is executed without checking the status of the flash memory 20b.

However in contrast to the third preferred embodiment, the controller 1 reads the physical address from the task register 40a to check the status of the flash memory 20a having that physical address, during an interval between the execution of the write instruction $W_{m+1}$ and the execution of the write instruction $W_{m+2}$. This is because, once the write instruction $W_{m+2}$ is executed, the physical address for the write instruction $W_{m+2}$ will be stored in the task register 40a and the physical address for the write instruction $W_m$ will be erased.

Then, after execution or inexecution of rewrite processing according to the result of the status check on the flash memory 20a (error or OK), write processing on the write instruction $W_{m+2}$ is performed on the flash memory 20c. The physical address for the write instruction $W_{m+2}$ is then stored in the task register 40a, not in the task register 40c shown in FIG. 5. That is, the task register 40a stores alternately the physical addresses used in the write processing performed on the corresponding flash memories 20a and 20c.

The write instruction $W_{m+3}$ for write processing on the flash memory 20d will be executed in a similar manner. First, the physical address is read from the task register 40b to check the status of the flash memory 20b. Then after rewriting to the flash memory 20b as necessary, the physical address for the write instruction $W_{m+3}$ is stored in the task register 40b.

The same is also true for the write instruction $W_{m+4}$ for write processing on the flash memory 20a: the physical address is read from the task register 40a to check the status of the flash memory 20c.

In the above operations, it is impossible to perform, in parallel, write processing on a greater number of flash memories than the functioning task registers 40a and 40b. This results in a reduction in power consumption in the flash memory group 20.

In this preferred embodiment, the data buffer 70a can serve for both the flash memories 20a and 20c and the data buffer 70b for both the flash memories 20b and 20d. This is because even if data is stored in the data buffers 70c and 70d corresponding respectively to the task registers 40c and 40d which hold no physical address, those data will not be used for rewriting.

By providing a task register number setting register 42 in the RAM 4, the above number of to-be-used task registers can be set with the drive parameter at factory formatting time as in the first preferred embodiment. The task register number setting register 42 may be achieved by merging with the frequency dividing register 14, for example, by using higher-order bits than the 2 bits 80.

Figure 8:
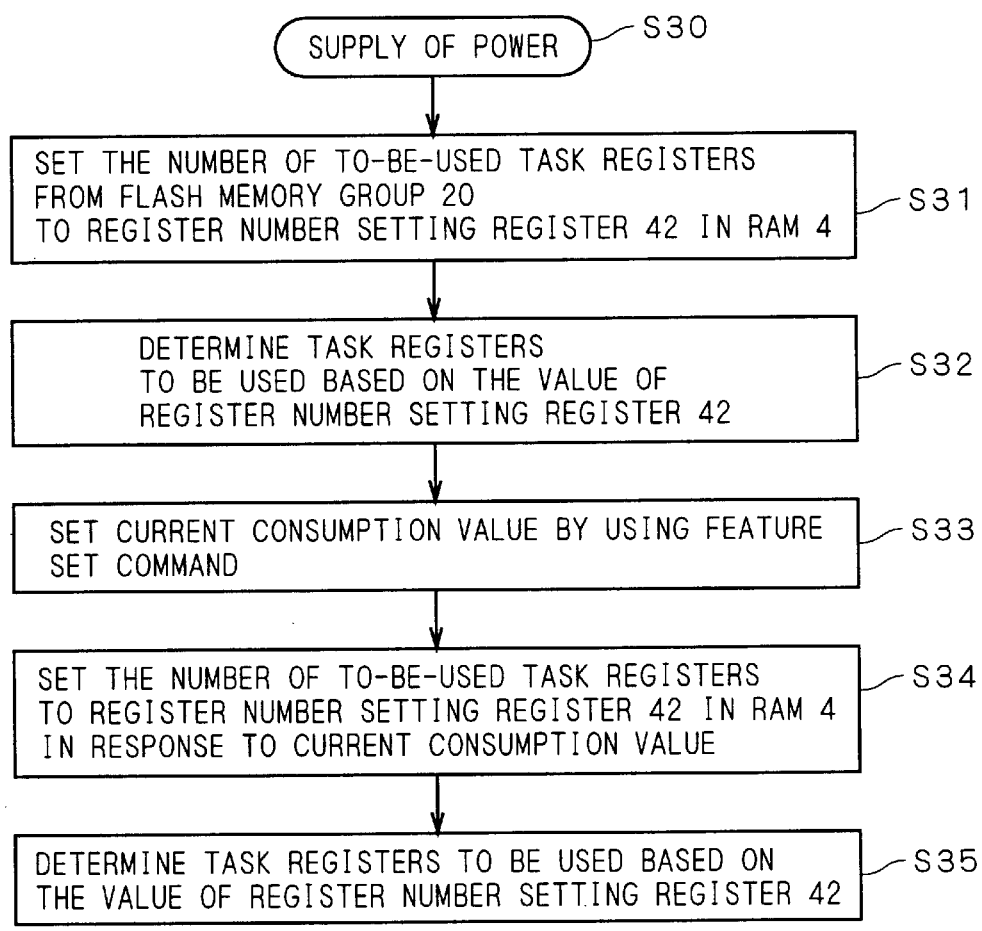
FIG. 8 is a flow chart showing the operation of the fourth preferred embodiment.

Further even if the number of to-be-used task registers is set to the default, the ATA card can change flash memories, which are operable in parallel, at the FEATURE SET command by associating the ATA commands with the task register number setting register 42. FIG. 8 illustrates such a change.

The flow starts upon the supply of power to the memory card 100 in step S30. In step S31, the CPU 5 reads the number of to-be-used task registers, which is set in the drive parameter, from the flash memory group 20 through the flash interface 8 and writes it into the task register number setting register 42 in the RAM 4. This defines the default value for the number of to-be-used task registers. In the above example, the default value for the number of to-be-used task registers is set to four, for example, which is the total number of task registers 40a to 40d provided for the CPU 4. Then in step S32, the CPU 5 determines task registers to be used on the basis of the value of the task register number setting register 42. In this case, all the task registers 40a to 40d will be used and thus they are brought into correspondence with the flash memories 20a to 20d.

Step S33 and later are processing to vary current consumption in the ATA card. More specifically, a desired value of current consumption is set in step S33 by using the FEATURE SET command. Then in step S34, the CPU 5 determines the number of to-be-use task registers in view of the current consumption value and sets it to the task register number setting register 42 in the RAM 4. In the next step S35, the CPU 5 determines the correspondence between the task registers and the flash memories.

To put it in FIG. 7, for example, the number of to-be-used task registers is set to two in step S34, and the task register 40*a* is used for the flash memories 20*a* and 20*c* and the task register 40*b* for the flash memories 20*b* and 20*d*. Of course, the task register 40*b* may be used for the flash memories 20*a* and 20*c* and the task register 40*a* for the flash memories 20*b* and 20*d*. For parallel write processing, however, it is desirable to use different task registers for N flash memories which are accessed consecutively in write processing, where N is the number of to-be-used task registers. Where N=3, for example, the task registers 40*a* will store alternately physical addresses corresponding to the flash memories 20*a*, 20*d*, 20*c*, 20*b*, 20*a*, . . . in a sequential order.

When the default value for the number of task registers is set less than the number of flash memories in the flash memory group 20, the number of to-be-used task registers will also be determined in step S32 as in step S35.

In this way, this preferred embodiment determines the number of to-be-used task registers by the default value when no command is given and by the number suitable for current consumption where a command to define current consumption is given. Since the number of flash memories to be candidates for parallel write processing is determined by the number of to-be-used task registers, power consumption in the memory card 100 can be reduced in response to requests from the host.

To increase the number of write processing performed in parallel, the number of task registers in the task register group 40 may be larger than that of flash memories in the flash memory group 20. For example when the flash memory group 20 includes two flash memories 20*a* and 20*b*, four task registers 40*a* to 40*d* may be provided. In this case, the status checks will be made after the completion of two write processing on the flash memories 20*a* and 20*b*.

While the invention has been shown and described in detail, the foregoing description is in all aspects illustrative and not restrictive. It is therefore understood that numerous modifications and variations can be devised without departing from the scope of the invention.

What is claimed is:

1. A memory card, comprising:
   a plurality of storage elements; and
   a plurality of task registers configured to store physical addresses used in writing to said plurality of storage elements,
   wherein one of said physical addresses remains unerased before a status check on corresponding one said plurality of storage elements is OK, and
   wherein one of said plurality of task registers alternately stores said physical addresses for at least two of said plurality of storage elements.

2. The memory card according to claim 1, further comprising:
   a task register number setting register configured to store a number of said plurality of task registers to be used to alternately store said physical addresses for at least two of said plurality of storage elements, said task register number setting register being located in a RAM attached to a CPU which controls operations of said plurality of storage elements.

3. The memory card according to claim 1, further comprising:
   data registers provided in correspondence with said task registers and configured to store write data written at said physical addresses.

4. The memory card according to claim 1, further comprising:
   data registers provided in correspondence with said task registers and configured to store write data written at said physical addresses.

5. The memory card according to claim 3, wherein said data registers are located in a buffer for said plurality of storage elements.

6. The memory card according to claim 4, wherein said data registers are located in a buffer for said plurality of storage elements.

* * * * *